(12) United States Patent
Miyamoto et al.

(10) Patent No.: US 9,126,297 B2
(45) Date of Patent: Sep. 8, 2015

(54) WORKPIECE CONVEYING ROBOT

(71) Applicant: DAIHEN Corporation, Osaka-shi, Osaka (JP)

(72) Inventors: Akira Miyamoto, Osaka (JP); Takaya Yamada, Osaka (JP); Jun Iura, Osaka (JP)

(73) Assignee: Daihen CORPORATION, Osaka (JP)

( * ) Notice: Subject to any disclaimer, the term of this patent is extended or adjusted under 35 U.S.C. 154(b) by 220 days.

(21) Appl. No.: 14/028,772

(22) Filed: Sep. 17, 2013

(65) Prior Publication Data

US 2014/0086717 A1 Mar. 27, 2014

(30) Foreign Application Priority Data

Sep. 25, 2012 (JP) ................................. 2012-210518

(51) Int. Cl.
*B25J 15/10* (2006.01)
*B23Q 7/04* (2006.01)
*B23Q 11/08* (2006.01)
*H01L 21/677* (2006.01)

(52) U.S. Cl.
CPC ................ *B23Q 7/046* (2013.01); *B23Q 11/08* (2013.01); *H01L 21/67742* (2013.01)

(58) Field of Classification Search
USPC ........ 294/213, 67.5, 67.1; 414/222.1, 223.01, 414/751.1, 941
See application file for complete search history.

(56) References Cited

U.S. PATENT DOCUMENTS

| 5,022,695 | A | * | 6/1991 | Ayers ........................... 294/197 |
| 5,133,635 | A | * | 7/1992 | Malin et al. ................ 414/744.8 |
| 5,540,098 | A | * | 7/1996 | Ohsawa ....................... 414/937 |
| 5,669,752 | A | * | 9/1997 | Moon ........................... 414/783 |
| 6,116,848 | A | * | 9/2000 | Thomas et al. .............. 414/754 |
| 6,216,883 | B1 | * | 4/2001 | Kobayashi et al. .......... 414/941 |
| 6,256,555 | B1 | * | 7/2001 | Bacchi et al. ................ 294/185 |
| 6,537,011 | B1 | * | 3/2003 | Wang et al. .................. 414/217 |
| 7,611,182 | B2 | * | 11/2009 | Kim et al. .................. 294/103.1 |
| 8,146,973 | B2 | * | 4/2012 | Roberts ........................ 294/213 |
| 8,203,101 | B2 | * | 6/2012 | Miyamoto et al. ......... 414/749.1 |
| 8,899,650 | B2 | * | 12/2014 | Furuta et al. ................. 294/188 |

FOREIGN PATENT DOCUMENTS

| JP | 2006-123135 | 5/2006 |
| JP | 2012-121680 | 6/2012 |

* cited by examiner

*Primary Examiner* — Paul T Chin
(74) *Attorney, Agent, or Firm* — Hamre, Schumann, Mueller & Larson, P.C.

(57) ABSTRACT

A workpiece conveying robot includes a base unit, a moving unit configured to move with respect to the base unit, a driving mechanism that drives the moving unit, and a detection unit. The moving unit includes a hand on which a workpiece is to be placed. The detection unit serves to detect information about the workpiece. Specifically, the detection unit includes a sensor provided at the hand, a base unit-side terminal provided at the base unit, and a moving unit-side terminal provided at the moving unit and electrically connected to the sensor. The base unit-side terminal and the moving unit-side terminal are brought into contact with each other when the moving unit is at a predetermined position.

10 Claims, 15 Drawing Sheets

WORKPIECE CONVEYING ROBOT

BACKGROUND OF THE INVENTION

1. Field of the Invention

The present invention relates to a workpiece conveying robot that supports and transports workpieces such as thin substrates with a hand. In particular, the present invention relates to a conveying robot that includes a detection unit that detects information of the workpiece on the hand.

2. Description of Related Art

The workpiece conveying robot is employed, for example, for transporting glass substrates in an LCD panel manufacturing plant. Techniques related to such workpiece conveying robots can be found, for example, in JP-A-No. 2012-121680.

The workpiece conveying robot according to JP-A-No. 2012-121680 is configured as an articulated robot. More specifically, the workpiece conveying robot includes the following. (1) A lower arm and an upper arm connected to each other so as to relatively rotate about a horizontal axis, (2) an upper base connected to the upper arm so as to rotate about a horizontal axis and a vertical axis, (3) a left arm and a right arm connected to the upper base so as to rotate about a vertical axis, and (4) a left hand and a right hand respectively attached to the distal end portion of the left arm and the right arm. The mentioned configuration allows the left and right hands to move to a desired position maintaining a horizontal orientation, by selectively rotating the lower arm, the upper arm, the upper base, and the left and right arms.

The left and right hands each include a sensor that detects the workpiece on the hand. A detection signal from the sensor is transmitted through a wiring to a control unit that controls the movement of each functional part of the workpiece conveying robot. The wiring is routed along the lower arm, the upper arm, the upper base, and the left and right arms, with a slack so as not to disturb the rotational movement of those components.

Some of the existing workpiece conveying robots include a linear moving mechanism that causes the hand to move in a horizontal linear stroke passage. For example, JP-A-No. 2006-123135 discloses such a workpiece conveying robot. The workpiece conveying robot according to JP-A-No. 2006-123135 includes a moving member placed on a pair of linear rails supported by a guide member, and a belt drive mechanism that drives the moving member. The guide member is movable in a vertical direction, and also rotatable. The moving member includes a hand on which the workpiece is to be placed.

The foregoing workpiece conveying robot including the linear moving mechanism may also include a sensor that detects the workpiece on the hand and a wiring connecting between the sensor and a control unit. In the robot including the linear moving mechanism, however, the wiring is bent in various patterns to follow up the long-range linear movement of the hand. To guide or protect the wiring that has to be bent, the wiring may be inserted through a bendable, caterpillar-shaped cable cover member.

However, since the cable cover member is bent and deformed owing to the transporting operation of the workpiece, particles may be generated at a slide-contact portion of the cable cover member, and the slide-contact portion may be damaged. Further, the wiring inside the cable cover member may also be damaged or disconnected, by repeatedly being bent in various patterns. In addition, in the case where the hand is set to travel over a long stroke passage the cable cover member also has to be extended, and may resultantly interfere with the rotational movement of the workpiece conveying robot.

SUMMARY OF THE INVENTION

The present invention has been proposed under the foregoing situation. It is therefore an object of the present invention to provide a workpiece conveying robot appropriately configured to detect information about a workpiece on a hand.

In an embodiment, the present invention provides a workpiece conveying robot including a base unit; a moving unit configured to move with respect to the base unit and including a hand on which a workpiece is to be placed; a driving mechanism that drives the moving unit; and a detection unit that detects information about the workpiece. The detection unit includes a sensor provided at the hand; a base unit-side terminal provided at the base unit; and a moving unit-side terminal provided at the moving unit and electrically connected to the sensor. The base unit-side terminal and the moving unit-side terminal are brought into contact with each other when the moving unit is at a predetermined position.

Preferably, the moving unit may be movable along a horizontal linear stroke passage. The moving unit-side terminal may be brought into contact with the base unit-side terminal unit when the moving unit is at one of a first position and a second position spaced from each other along the stroke passage.

Preferably, the base unit-side terminal may include a first terminal unit and a second terminal unit spaced from each other along the stroke passage and respectively corresponding to the first position and the second position.

Preferably, the moving unit may be movable along the horizontal linear stroke passage. The moving unit-side terminal may be brought into contact with the base unit-side terminal unit when the moving unit is in a range of a predetermined length along the stroke passage.

Preferably, the foregoing workpiece conveying robot may further include a shifting unit that displaces the base unit-side terminal between a reference position and a contact position. The base unit-side terminal may be out of contact with the moving unit-side terminal when the base unit-side terminal is at the reference position, and in contact with the moving unit-side terminal when the base unit-side terminal is at the contact position.

Preferably, the shifting unit may include an elastic member that urges the base unit-side terminal in a direction intersecting the stroke passage when the base unit-side terminal is at the contact position.

Preferably, the foregoing workpiece conveying robot may further include a shifting unit that displaces the moving unit-side terminal between a reference position and a contact position. The moving unit-side terminal may be out of contact with the base unit-side terminal when the moving unit-side terminal is at the reference position, and in contact with the base unit-side terminal when the moving unit-side terminal is at the contact position.

Preferably, the shifting unit may include an elastic member that urges the moving unit-side terminal in a direction intersecting the stroke passage when the moving unit-side terminal is at the contact position.

Preferably, the driving mechanism may include a driving pulley, and an output belt engaged with the driving pulley so as to reciprocate in a predetermined range along the stroke passage. The moving unit may be connected to the output belt via a joint member.

Preferably, the sensor may include a plurality of sensing units.

Other features and advantages of the present invention will become more apparent through detailed description given below referring to the accompanying drawings.

DETAILED DESCRIPTION OF PREFERRED EMBODIMENTS

Figure 1:
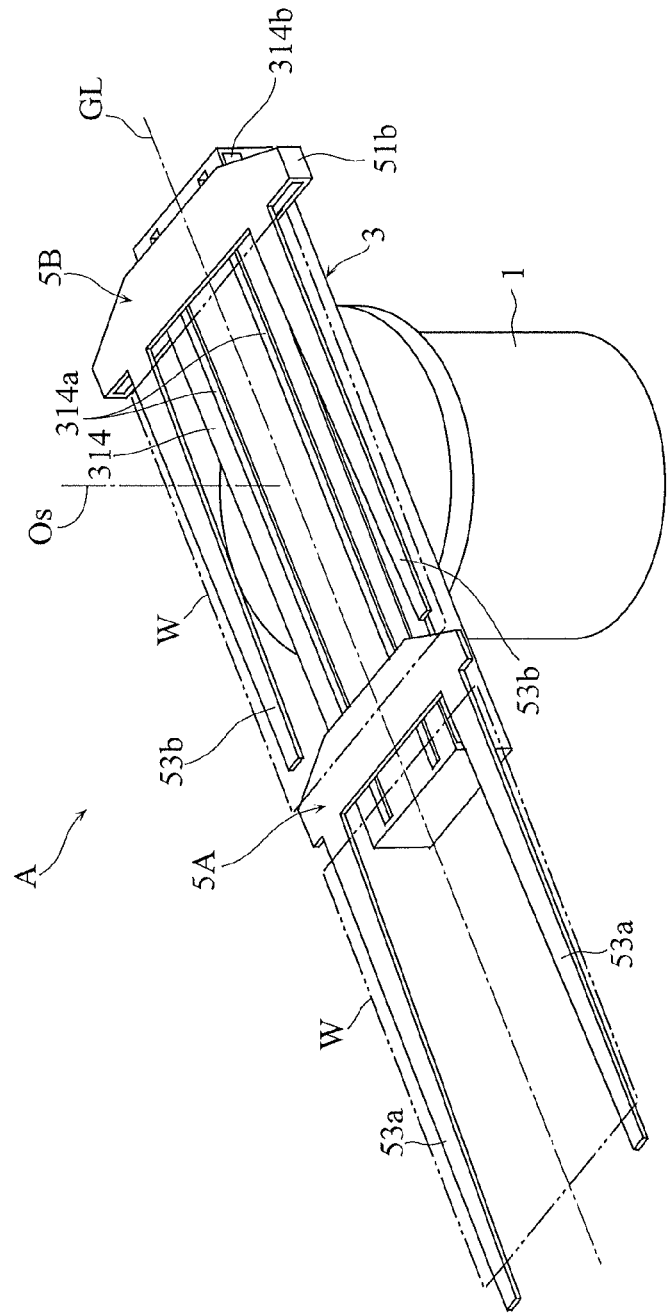
FIG. 1 is a perspective view showing a workpiece conveying robot according to an embodiment of the present invention.
Figure 2:
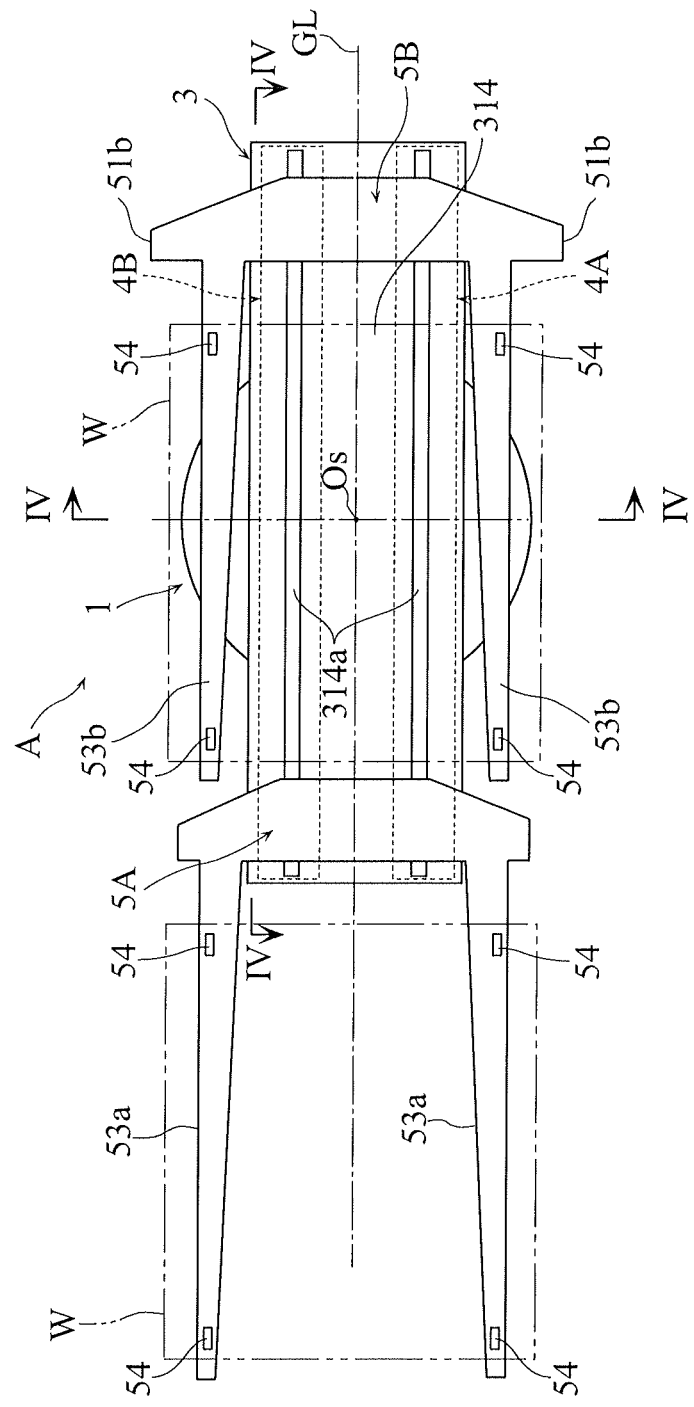
FIG. 2 is a plan view of the workpiece conveying robot.
Figure 3:
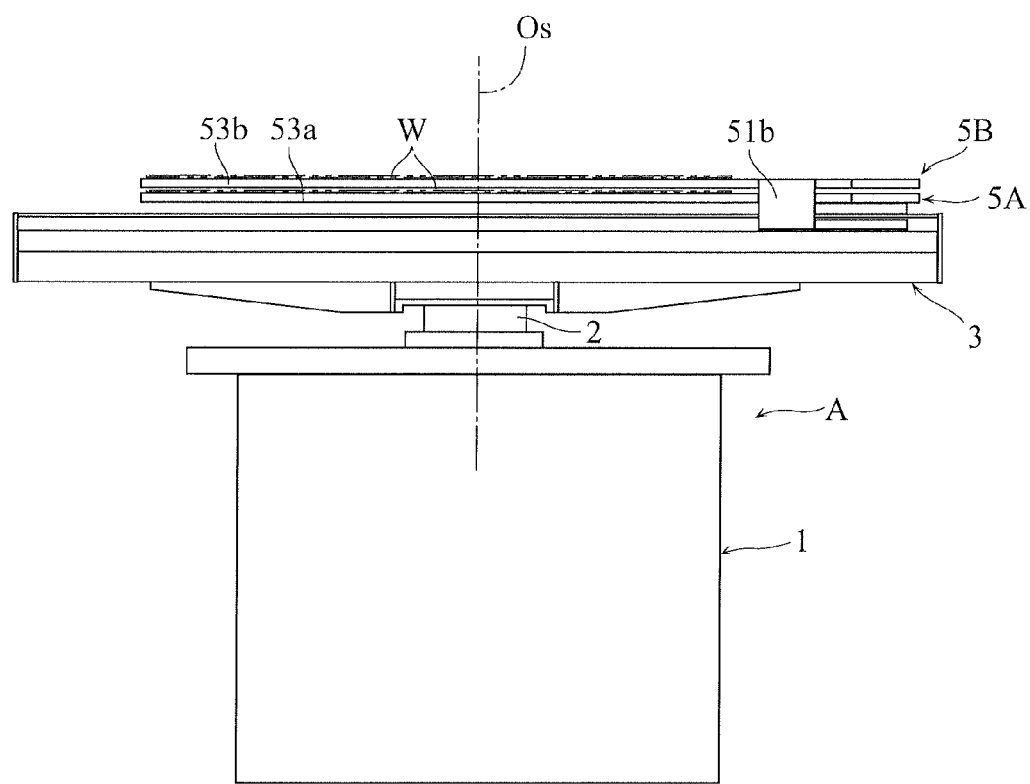
FIG. 3 is a side view of the workpiece conveying robot.

FIGS. 1 to 8 illustrate a workpiece conveying robot according to an embodiment of the present invention. The workpiece conveying robot A according to this embodiment is intended for conveying a thin plate-shaped workpiece W such as a glass substrate for an LCD panel. As shown in FIGS. 1 to 3, the workpiece conveying robot A includes a fixed base 1, a rotary base 2 supported by the fixed base 1, a guide body 3 supported by the rotary base 2, belt drive mechanisms 4A, 4B (see FIG. 2) located inside the guide body 3, a pair of moving members 5A, 5B supported by the guide body 3, a control unit 6 (see FIG. 6) that controls the operation of the workpiece conveying robot A, and a detection unit that detects information about the workpiece W.

The rotary base 2 is movable up and downward with respect to the fixed base 1, and supported by the fixed base 1 so as to rotate about a rotational axis Os. The fixed base 1 includes thereinside an elevating motor and a rotating motor, by which the rotary base 2 is driven to ascend, descend, or rotate. The guide body 3 has a rectangular box shape in a plan view. The guide body 3 includes thereinside a pair of guide rails 32A that supports the moving member 5A, and a pair of guide rails 32B that supports the moving member 5B. The moving members 5A, 5B are respectively supported by the guide rails 32A, 32B so as to slide along a horizontal linear stroke passage GL without interfering with each other.

The belt drive mechanism 4A serves to cause the moving member 5A to slide on the guide rails 32A, and the belt drive mechanism 4B serves to cause the moving member 5B to slide on the guide rails 32B (see FIG. 2). A support structure for the rotary base 2, a mechanism to elevate or lower the rotary base 2, and a mechanism to rotate the rotary base may be realized according to the disclosure in JP-A-No. 2006-123135.

Figure 4:
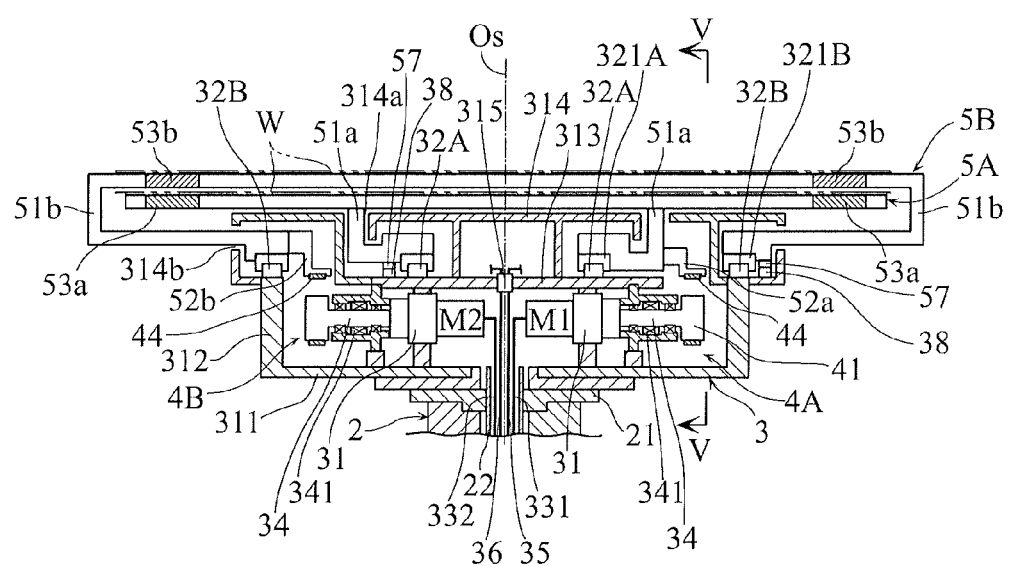
FIG. 4 is a cross-sectional view taken along a line IV-IV in FIG. 2.

The guide body 3 is of a rectangular shape having a longitudinal axis horizontally extending along the stroke passage GL, in a plan view. As shown in FIG. 4, the guide body 3 includes a bottom wall 311, a side wall 312, an inner wall 313, and a cover 314. The guide body 3 is fixed to the rotary base 2, and hence rotates together with the rotary base 2 when the rotary base 2 is made to rotate. A seal mechanism 21 is interposed between the rotary base 2 and the guide body 3. A hollow shaft 22, through which wirings pass from the fixed base 1 to the guide body 3 through the rotary base 2, is provided in a radially inner portion of the rotary base 2. The pair of guide rails 32A on the inner side is supported by the inner wall 313, and the pair of guide rails 32B on the outer side is supported by the side wall 312.

The guide body 3 includes thereinside motors M1, M2 that respectively drive the moving members 5A, 5B. The output shafts of the motors M1, M2 are each connected to a driving pulley 41 of the belt drive mechanism 4A or 4B, via a speed reduction mechanism 31 and an input shaft 34.

Through inside the hollow shaft 22, wirings 331, 332 for respectively supplying a driving current to the motors M1, M2 and wirings 35, 36 for connecting between the sensor 54 and the control unit 6 are routed. An inlet terminal 315 is air-tightly attached to the inner wall 313, and the wirings 35, 36 are disposed through the inlet terminal 315 so as to reach a position above the inner wall 313.

A pair of support arms 51a is provided under the moving member 5A, and a slider 321A is attached to each of the support arms 51a. The moving member 5A is supported by the pair of guide rails 32A via the support arms 51a and the sliders 321A. Likewise, the moving member 5B is supported by the pair of guide rails 32B via a pair of support arms 51b and the sliders 321B. The support arms 51b are each configured so as to circumvent the side edge of the moving member 5A. The sliders 321B are respectively attached to the support arms 51b. The region above the guide rails 32A, 32B is covered with the cover 314. The support arms 51a of the moving member 5A are each disposed so as to penetrate through a slit 314a formed in the cover 314, and a joint member 52a is attached to each of the support arms 51a. The joint member 52a is connected to an output belt 44 of the belt drive mechanism 4A through a slit formed in the inner wall 313. As for the moving member 5B, the support arms 51b are each disposed so as to penetrate through a slit 314b formed in the side face of the cover 314, and a joint member 52b is attached to each of the support arms 51b. The joint member 52b is connected to an output belt 44 of the belt drive mechanism 4B through a slit formed in the inner wall 313.

As shown in FIGS. 1 to 4, the moving members 5A, 5B respectively include fork-shaped hands 53a, 53b formed integrally therewith so as to extend longitudinally of the guide body 3. The hands 53a, 53b serve to retain the workpiece W in a horizontal posture, and each include a pair of retention elements. A plurality of sensors 54 (see FIG. 2) is provided on each of the hands 53a, 53b, for detecting the workpiece W placed thereon. FIGS. 3 and 4 illustrate, unlike FIGS. 1 and 2, the state in which both of the moving members 5A, 5B (hands 53a, 53b) are located above the fixed base 1.

Figure 5:
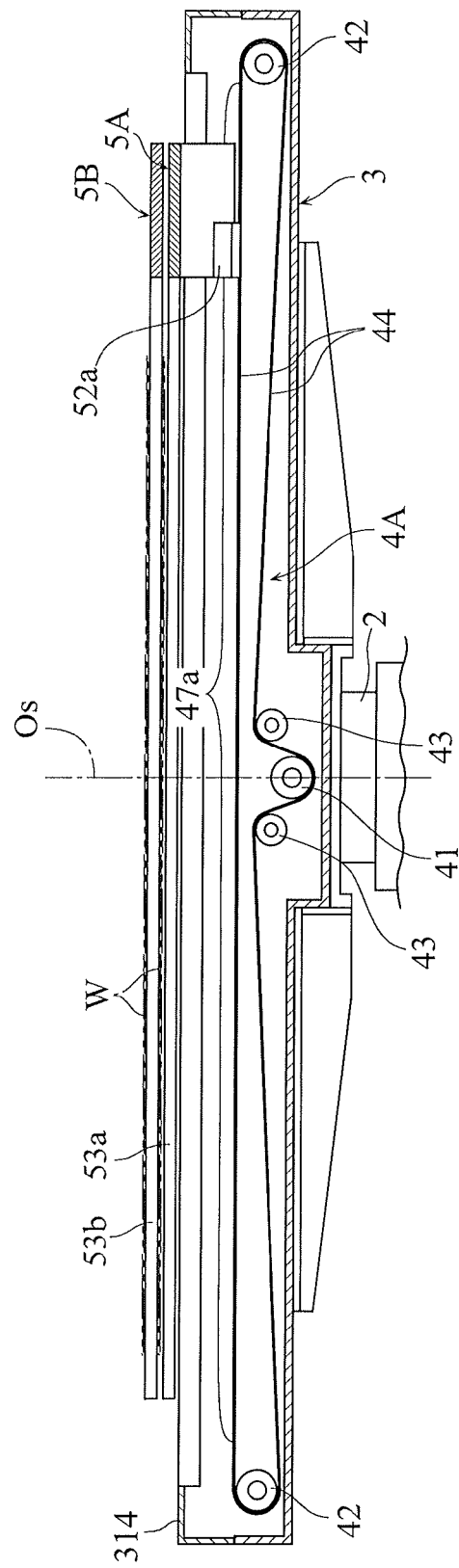
FIG. 5 is a cross-sectional view taken along a line V-V in FIG. 4.

Referring now to FIG. 5, the belt drive mechanism 4A includes a driving pulley 41, a pair of slave pulleys 42, a pair of idler pulleys 43, and an endless output belt 44 engaged with the mentioned pulleys. The belt drive mechanism 4B is also configured similarly to the belt drive mechanism 4A.

The driving pulley 41, the slave pulleys 42, and the idler pulleys 43 are supported by the guide body 3, so as to rotate about axial lines parallel to each other. As shown in FIG. 5, the output belt 44 can be divided into an upper portion and a lower portion with respect to the left and right slave pulleys 42, and the lower portion is engaged with the driving pulley 41 and the pair of idler pulleys 43.

As is apparent in FIG. 5, the driving pulley 41 is located at the central position of the guide body 3 longitudinally thereof. As shown in FIG. 4, the driving pulley 41 is fixed to the input shaft 34 made to rotate by the driving force of the motor M1. A seal mechanism 341 is interposed between the input shaft 34 and the guide body 3. The seal mechanism 341 serves to air-tightly seal the inner central space of the guide body 3, from ambient air outside the workpiece conveying robot. The inner central space of the guide body 3 communicates with the inner space of the fixed base 1 via the rotary base 2. Accordingly, the seal mechanism 341 also serves to air-tightly seal the inner space of the fixed base 1 from ambient air outside the workpiece conveying robot.

The pair of slave pulleys 42 is spaced from each other in the longitudinal direction of the guide body 3 (parallel to the stroke passage GL). As shown in FIG. 5, the slave pulley 42 on the right is located close to the right end portion of the guide body 3, and the slave pulley 42 on the left is located close to the left end portion of the guide body 3. The slave pulleys 42 are rotatably supported by the respective support shaft.

The pair of idler pulleys 43b is located on the respective sides of the driving pulley 41 in the direction in which the output belt 44 runs. The idler pulleys 43 are rotatably supported by the respective support shaft. The idler pulleys 43 are disposed in contact with the outer surface of the output belt 44, so as to provide appropriate tension to the output belt 44. For example, a timing belt may be employed as the output belt 44.

In the passage of the output belt 44, the upper region of the slave pulley 42 constitutes a linear stroke range 47a along the stroke passage GL. The output belt 44 is set to reciprocate in the linear stroke range 47a. In the linear stroke range 47a, the joint member 52a extending from the support arm 51a of the moving member 5A is connected to a predetermined position of the output belt 44. When the output belt 44 is made to reciprocate by the rotation of the driving pulley 41, the joint member 52a is caused to reciprocate together with the output belt 44 in the linear stroke range 47a. Such movement of the joint member 52a causes the moving member 5A (hand 53a) to horizontally slide along the stroke passage GL, supported by the pair of inner guide rails 32A. In the belt drive mechanism 4B, likewise, the joint member 52b extending from the support arm 51b of the moving member 5B is connected to a predetermined position of the output belt 44. Therefore, the moving member 5B (hand 53b) is made to horizontally slide along the stroke passage GL, supported by the pair of outer guide rails 32B.

The workpiece conveying robot A is employed for introducing and dispatching the workpiece W into and from a processing chamber in the manufacturing process of an LCD panel. In this case, the workpiece conveying robot A is installed, for example, in a vacuum atmosphere in a transport chamber including a plurality of processing chambers located around the workpiece conveying robot A.

The linear stroke range 47a normally has a sufficient length, such as 4 meters, to cope with the increase in size of the workpiece W placed on the hands 53a, 53b, as well as of the transport distance of the workpiece W. In addition, the workpiece conveying robot A is required to transport the workpiece W at a higher speed. The linear moving speed of the hands 53a, 53b (output belt 44) for conveying the workpiece W is set, for example, at 3 meters per second at maximum.

The moving member 5A (hand 53a) shown in FIGS. 1 and 2 is sticking out from the guide body 3, so as to deliver the workpiece W to the processing chamber (delivery position). In contrast, the moving member 5A (hand 53a) shown in FIGS. 3 and 4 is retracted to the guide body 3, so that the rotary base 2 can rotate (initial position). Here, the delivery position and the initial position correspond to the positions where the moving member 5A or 5B temporarily stops after linearly moving at a high speed.

The hands 53a, 53b each include, as shown in FIG. 2, a pair of sensors 54 located at a proximal position and a distal position of each of the pair of retention elements constituting the hands 53a (53b).

The sensors 54 are configured to detect the presence of the workpiece W on the hand 53a (53b). The sensors 54 each include, for example, an upwardly urged lever switch, so that the switch is opened when the workpiece W is not on the hand, and closed by the weight of the workpiece W when the workpiece W is placed on the hand. As a matter of course, the sensors 54 may be configured in different manners as long as the sensor is capable of detecting the presence of the workpiece W at a predetermined position on the hand 53a, 53b.

Figure 6:
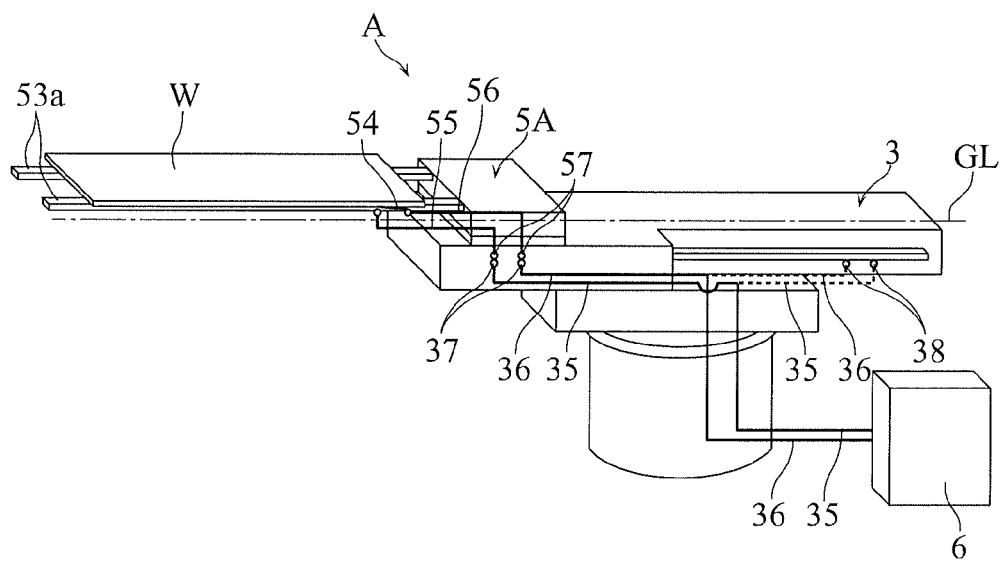
FIG. 6 is a schematic perspective view showing an example of a wiring route in a detection unit.

The workpiece conveying robot A includes a wiring through which a detection signal of the workpiece W outputted from the sensor 54 is transmitted to the control unit 6. FIG. 6 is a schematic perspective view showing a wiring route between the sensor 54 and the control unit 6. For the sake of clarity, FIG. 6 illustrates the wiring of only one of the sensors 54 of the hand 53a.

As shown in FIG. 6, the wiring connecting between the sensor 54 and the control unit 6 is split into the wiring 35, 36 on the side of the guide body 3 and wirings 55, 56 on the side of the moving member 5A. The guide body 3 includes a pair of terminal units 37 and another pair of terminal units 38. The pair of terminal units 37 and the pair of terminal units 38 are spaced from each other along the stroke passage GL. The wiring 35 has an end connected to the control unit 6, and the other end branched to be connected to one of the terminal units 37 and one of the terminal units 38. The wiring 36 has an end connected to the control unit 6, and the other end branched to be connected to the other of the terminal units 37 and the other of the terminal units 38.

The moving member 5A includes a pair of terminal units 57. The wiring 55 is connected to the sensor 54 and one of the terminal units 57, and the wiring 56 is connected to the sensor 54 and the other of the terminal units 57.

In the state shown in FIG. 6, the moving member 5A (hand 53a) is at the delivery position (first position), and the pair of terminal units 37 of the guide body 3 and the pair of terminal units 57 of the moving member 5A are in contact with each other. Accordingly, a closed circuit is formed among the control unit 6, the wirings 35, 36, the wirings 55, 56, and the sensor 54, and therefore the presence of the workpiece W on the hand 53a can be detected.

Figure 7:
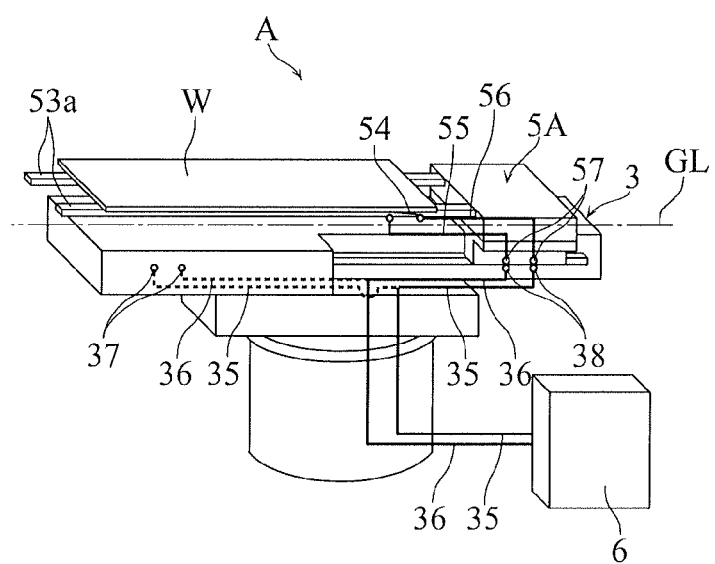
FIG. 7 is a schematic perspective view showing another example of the wiring route in the detection unit.

Referring to FIG. 7, in contrast, the moving member 5A (hand 53a) is at the initial position (second position), and the pair of terminal units 38 of the guide body 3 and the pair of terminal units 57 of the moving member 5A are in contact with each other. Accordingly, a closed circuit is formed among the control unit 6, the wirings 35, 36, the wirings 55, 56, and the sensor 54, and therefore the presence of the workpiece W on the hand 53a can be detected. The remaining sensors 54 not illustrated in FIGS. 6 and 7 (provided at the other hand 53b) are also connected to the wirings 35, 36, 55, 56, and the terminal units 37, 38, 57 configured similarly to those connected to the aforementioned sensor 54.

In the case where the workpiece W is not on the hand 53a (53b), the switch of the sensor 54 is open. When the terminal unit 37(38) and the terminal unit 57 are brought into contact with each other, the control unit 6 decides that abnormality has emerged regarding the placement of the workpiece W, and stops the operation of the workpiece conveying robot A.

Figure 8A:
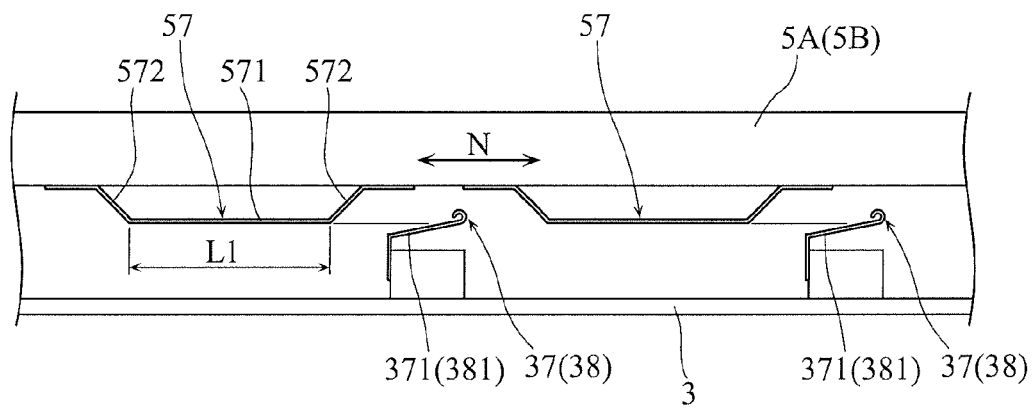
FIGS. 8A and 8B are schematic cross-sectional views showing an example of a base unit-side terminal unit, a moving unit-side terminal unit, and a support structure therefor.
Figure 8B:
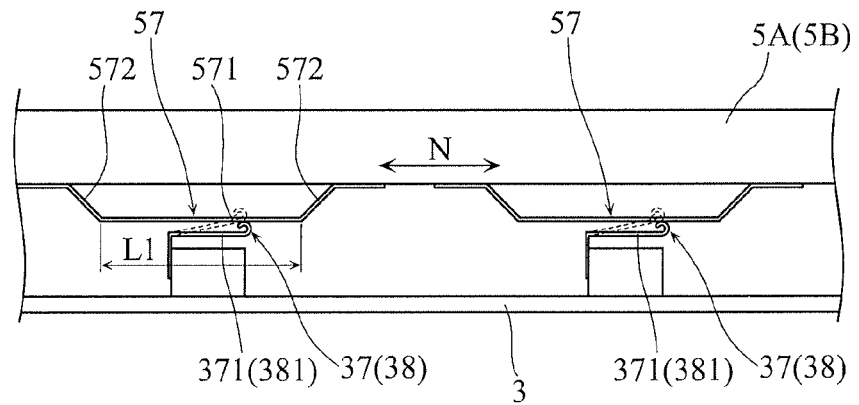

FIGS. 8A and 8B illustrate the terminal unit 37 (38), the terminal unit 57 and the support structure therefor, viewed in a direction orthogonal to the stroke passage GL and at the same level in height. In this embodiment, the terminal units 37 (38), 57 are located on the outer side of the guide rails 32A, 32B (see FIG. 4). As shown in FIGS. 8A and 8B, the terminal unit 37 (38) is located at the tip portion of a shifting unit. In this embodiment, the shifting unit a leaf spring 371 (381) formed of a cantilever-shaped conductive material. The terminal unit 57 is formed of a metal plate. The leaf spring 371 (381) is attached to the guide body 3 via an insulating member, and the terminal unit 57 is attached to the moving member 5A (5B) via an insulating member.

The terminal unit 57 includes a flat portion 571 having its longitudinal sides extending along the stroke passage GL of the moving member 5A (5B), and sloped portions 572 formed on the respective sides of the flat portion 571 in the longitudinal direction.

As shown in FIG. 8A, the terminal unit 37 (38) is in its natural state when the terminal unit 37 (38) is out of contact with the terminal unit 57. In this state, the terminal unit 37 (38) assumes a reference position on the upper side of the flat portion 571 (terminal unit 57), owing to the elastic restoring force of the leaf spring 371 (381). With the foregoing configuration, the terminal unit 57 (flat portion 571) is brought into contact with the terminal unit 37 (38) as shown in FIG. 8B when the moving member 5A (5B) is in a range of a predetermined length L1 corresponding to the length of the flat portion 571 in the moving direction N, while moving along the stroke passage GL. When the moving member 5A (5B) is in such a section, the terminal unit 37 (38) assumes a contact position shifted downward from the reference position, in other words the terminal unit comes closer to the guide body 3. At the contact position, the terminal unit 37 (38) is urged upward (direction intersecting the direction N) by the leaf spring 371 (381). In FIG. 8B, the terminal unit 37 (38) assuming the reference position and the leaf spring 371 (381) are indicated by broken lines.

When the terminal unit 37 (38) starts to contact the terminal unit 57, the terminal unit 37 (38) is first made to abut the sloped portion 572. Accordingly, the impact of the contact is mitigated. In addition, when the terminal unit 37 (38) is disengaged from the terminal unit 57, the terminal unit 37 (38) is smoothly guided along the sloped portion 572. In FIGS. 8A and 8B, the terminal unit 37 (38) and the terminal unit 57 are brought into contact with each other both when the moving member 5A (5B) moves from the left to the right and from the right to the left, in the direction N. This is also the case with the configurations shown in FIGS. 9A to 13C, which will be subsequently described.

The advantages of the workpiece conveying robot A will now be described.

In the workpiece conveying robot A configured as above, the moving members 5A, 5B (hands 53a, 53b) move along the horizontal linear stroke passage GL supported by the guide rails 32A, 32B. In addition, the linear stroke range 47a of the moving member 5A (5B) (hand 53a, 53b) has a sufficient length, such as 4 meters, to cope with the increase in size of the workpiece W. The hands 53a, 53b include the sensors 54 that detect the presence of the workpiece W on the hands 53a, 53b. The sensor 54 detects whether the workpiece W is present when the terminal unit 37 (38) of the guide body 3 and the terminal unit 57 of the moving member 5A (5B) make contact with each other. Such a configuration allows the wiring of the sensor 54 to be divided between the guide body 3 and the moving member 5A (5B), thereby preventing the wiring from being damaged or disconnected.

The terminal unit 37 (38) of the guide body 3 is electrically connected to the terminal unit 57 of the moving member 5A (5B) when the moving member 5A (5B) is at a predetermined position, namely the delivery position and the initial position. As described above, the delivery position and the initial position are where the moving member 5A (5B) temporarily stops after linearly moving at a high speed. At such a stopping position, the workpiece W being conveyed is prone to shift from the proper position. In this embodiment, however, since the terminal unit 37 (38) of the guide body 3 is located at the position corresponding to the moving member 5A (5B) located at the delivery position and the initial position, the workpiece W on the hand 53a, 53b can be detected when the moving member 5A (5B) is at the delivery position and the initial position.

The workpiece conveying robot A is configured to horizontally drive the moving member 5A (5B) over a long distance. In addition, the workpiece conveying robot A is often installed in a high-temperature environment, and hence the parts of the workpiece conveying robot A are prone to suffer thermal deformation. Therefore, the predetermined positions (delivery position and initial position) where the moving member 5A (5B) is supposed to be located may be slightly shifted along the stroke passage GL. In this embodiment, however, as described above referring to FIGS. 8A and 8B, the terminal unit 57 of the moving member 5A (5B) is brought into contact with the terminal unit 37 (38), when the moving member 5A (5B) enters the range of the predetermined length L1 in the moving direction N. Such a configuration allows the terminal unit 57 and the terminal unit 37 (38) to make contact with each other in the range of the predetermined length L1, thereby enabling the workpiece W on the hand 53a (53b) to be detected despite the delivery position and the initial position where the moving member 5A (5B) is supposed to be located being slightly shifted.

The terminal unit 37 (38) of the guide body 3 is urged upward (direction intersecting the direction N parallel to the stroke passage GL) by the leaf spring 371 (381), when the terminal unit 37 (38) is in contact with the terminal unit 57 of the moving member 5A (5B). Such a configuration assures that the terminal units 37 (38) and 57 are brought into contact with each other, thereby allowing the workpiece W on the hand 53a (53b) to be properly detected.

Providing the plurality of sensors 54 at the hand 53a (53b) allows different situations of the workpiece W, such as a positional shift or distortion, to be detected with each of the plurality of sensors 54.

FIGS. 9A to 14B illustrate the variations of the terminal units 37 (38), 57 and the support structure therefor.

Figure 9A:
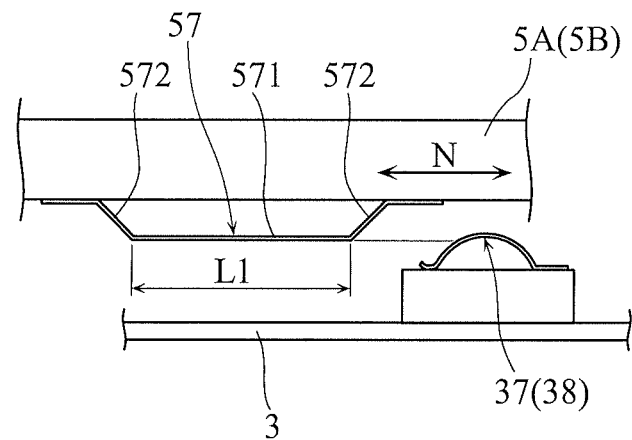
FIGS. 9A and 9B are schematic cross-sectional views showing another example of the base unit-side terminal unit, the moving unit-side terminal unit, and the support structure therefor.
Figure 9B:
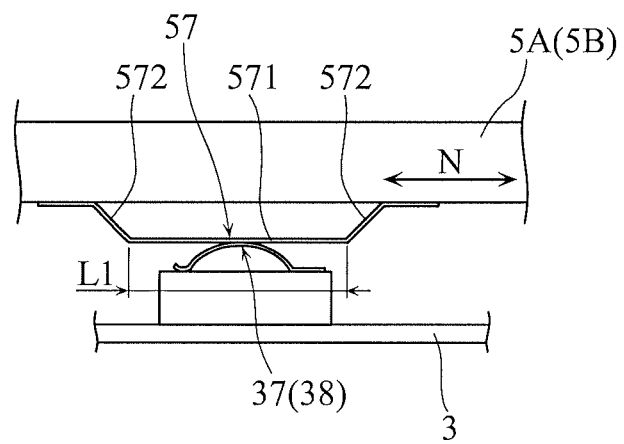

In the example shown in FIGS. 9A and 9B, the terminal unit 57 of the moving member 5A (5B) has the same configuration as that shown in FIGS. 8A and 8B, however the terminal unit 37 (38) of the guide body 3 is different from that of FIGS. 8A and 8B. In this variation, the terminal unit 37 (38) is formed of an arcuate leaf spring protruding upward, and hence the terminal unit 37 (38) itself serves as an elastic member.

As shown in FIG. 9A, the terminal unit 37 (38) is in its natural state when the terminal unit 37 (38) is out of contact with the terminal unit 57. In this state, the topmost portion of the terminal unit 37 (38) is at the reference position on the upper side of the flat portion 571 of the terminal unit 57.

As shown in FIG. 9B, the terminal unit 57 (flat portion 571) is brought into contact with the terminal unit (38) when the moving member 5A (5B) is displaced. This contact is maintained over the range of the predetermined length corresponding to the length L1 of the flat portion 571 in the direction N. Such a configuration allows the terminal unit 57 and the terminal unit 37 (38) to make contact with each other, thereby enabling the workpiece W on the hand 53a (53b) to be detected despite the delivery position and the initial position where the moving member 5A (5B) is supposed to be located being slightly shifted. In addition, the topmost portion of the terminal unit 37 (38) of the guide body 3 is in the contact position displaced downward from the reference position, when the terminal unit 37 (38) is in contact with the terminal unit 57 of the moving member 5A (5B). Accordingly, the topmost portion of the terminal unit 37 (38) is urged upward by the restoring force of the leaf spring 371 (381), when the terminal unit 37 (38) is in contact with the terminal unit 57 of the moving member 5A (5B). Such a configuration assures that the terminal units 37 (38) and 57 are brought into contact with each other, thereby allowing the workpiece W on the hand 53a (53b) to be properly detected.

Figure 10A:
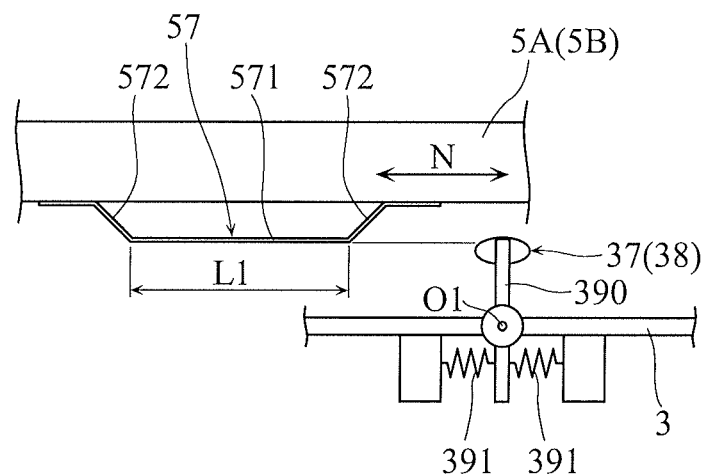
FIGS. 10A and 10B are schematic cross-sectional views showing still another example of the base unit-side terminal unit, the moving unit-side terminal unit, and the support structure therefor.
Figure 10B:
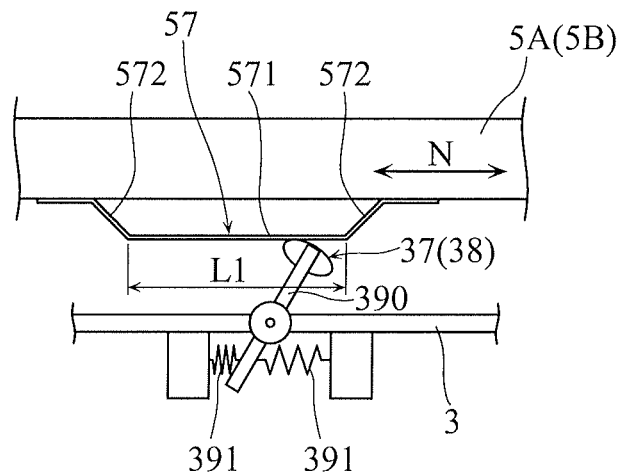

In the example shown in FIGS. 10A and 10B, the terminal unit 57 of the moving member 5A (5B) has the same configuration as that shown in FIGS. 8A and 8B, however the terminal unit 37 (38) of the guide body 3 and the support structure therefor are different from those of FIGS. 8A to 9B. In this variation, the terminal unit 37 (38) is provided at the tip portion of a bar-shaped member 390 disposed so as to pivot about a horizontal axial line O1 orthogonal to the stroke passage GL. The other end portion of the bar-shaped member 390 is urged by a pair of coil springs 391 (elastic members) located on the respective sides of the bar-shaped member 390 in the direction N parallel to the stroke passage GL.

As shown in FIG. 10A, the terminal unit 37 (38) is in its natural state when the terminal unit 37 (38) is out of contact with the terminal unit 57. In this state, the terminal unit 37 (38) is at the reference position on the upper side of the flat portion 571 of the terminal unit 57, owing to the elastic restoring force of the coil springs 391.

The terminal unit 57 (flat portion 571) is brought into contact with the terminal unit 37 (38) as shown in FIG. 10B, when the moving member 5A (5B) enters the range of the predetermined length corresponding to the length L1 of the flat portion 571 in the direction N, while moving along the stroke passage GL. Such a configuration allows the terminal unit 57 and the terminal unit 37 (38) to make contact with each other, thereby enabling the workpiece W on the hand 53a (53b) to be detected despite the delivery position and the initial position where the moving member 5A (5B) is supposed to be located being slightly shifted. In addition, the terminal unit 37 (38) of the guide body 3 is in the contact position displaced downward from the reference position and thus urged by the coil springs 391 in the direction intersecting the direction N (upward in FIG. 10B), when the terminal unit 37 (38) is in contact with the terminal unit 57 of the moving member 5A (5B). Such a configuration assures that the terminal units 37 (38) and 57 are brought into contact with each other, thereby allowing the workpiece W on the hand 53a (53b) to be properly detected.

Figure 11A:
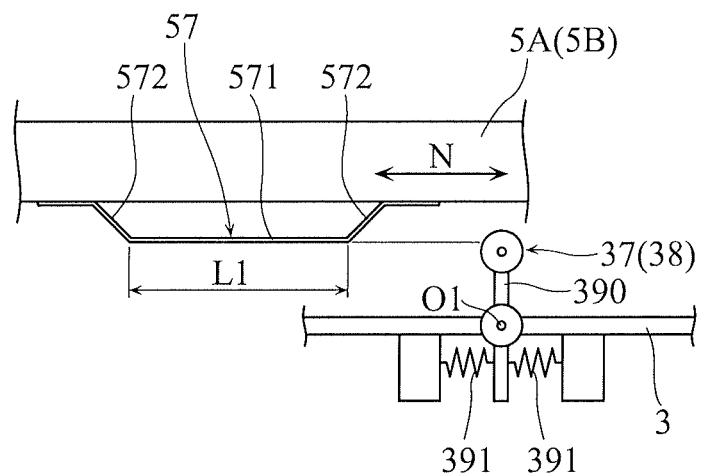
FIGS. 11A and 11B are schematic cross-sectional views showing still another example of the base unit-side terminal unit, the moving unit-side terminal unit, and the support structure therefor.
Figure 11B:
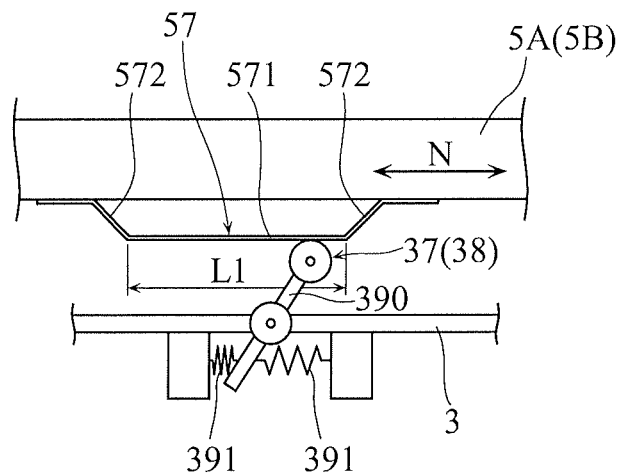

In the example shown in FIGS. 11A and 11B, the terminal unit 57 of the moving member 5A (5B) has the same configuration as that shown in FIGS. 10A and 10B, however the terminal unit 37 (38) of the guide body 3 is different from that of FIGS. 10A and 10B. In this variation, the terminal unit 37 (38) is has a cylindrical outer shape, and rotatably supported by an end portion of the bar-shaped member 390.

As shown in FIG. 11A, the terminal unit 37 (38) is in its natural state when the terminal unit 37 (38) is out of contact with the terminal unit 57. In this state, the terminal unit 37 (38) is at the reference position on the upper side of the flat portion 571 of the terminal unit 57, owing to the elastic restoring force of the coil springs 391.

The terminal unit 57 (flat portion 571) is brought into contact with the terminal unit 37 (38) as shown in FIG. 11B, when the moving member 5A (5B) enters the range of the predetermined length corresponding to the length L1 of the flat portion 571 in the direction N, while moving along the stroke passage GL. Such a configuration allows the terminal unit 57 and the terminal unit 37 (38) to make contact with each other, thereby enabling the workpiece W on the hand 53a (53b) to be detected despite the delivery position and the initial position where the moving member 5A (5B) is supposed to be located being slightly shifted. In addition, the terminal unit 37 (38) of the guide body 3 is in the contact position displaced downward from the reference position and thus urged by the coil springs 391 in the direction intersecting the direction N (upward in FIG. 11B), when the terminal unit 37 (38) is in contact with the terminal unit 57 of the moving member 5A (5B). Such a configuration assures that the terminal units 37 (38) and 57 are brought into contact with each other, thereby allowing the workpiece W on the hand 53a (53b) to be properly detected.

In this variation, further, since the terminal unit 37 (38) is configured so as to rotate, the terminal unit 37 (38) rolls on the terminal unit 57 (flat portion 571) when the moving member 5A (5B) moves while the terminal unit 37 (38) is in contact with the terminal unit 57. Such an arrangement prevents generation of particles.

Figure 12A:
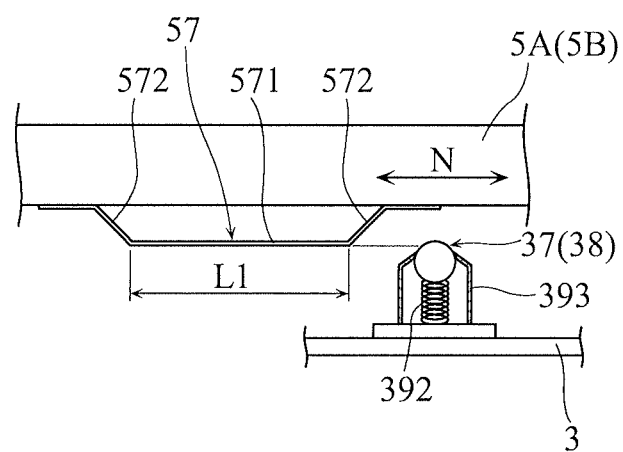
FIGS. 12A and 12B are schematic cross-sectional views showing still another example of the base unit-side terminal unit, the moving unit-side terminal unit, and the support structure therefor.
Figure 12B:
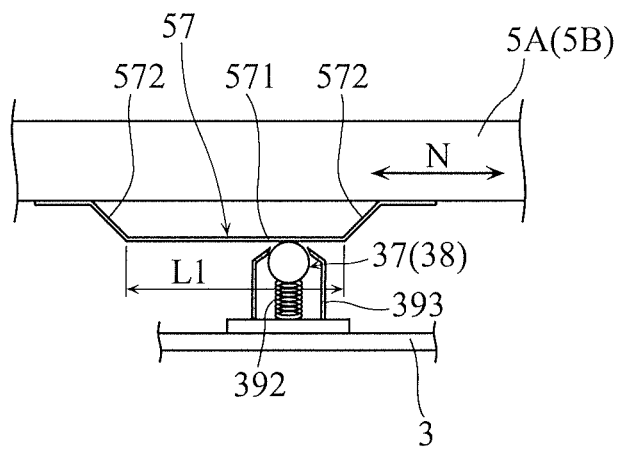

In the example shown in FIGS. 12A and 12B, the terminal unit 57 of the moving member 5A (5B) has the same configuration as that shown in FIGS. 8A and 8B, however the terminal unit 37 (38) of the guide body 3 and the support structure therefor are different from those of FIGS. 8A to 11B. In this variation, the terminal unit 37 (38) is formed of a metal ball and supported by a compressed coil spring 392 having its lower end portion fixed to the guide body 3. The terminal unit 37 (38) and the compressed coil spring 392 are enclosed in a cylindrical body 393 of a tapered shape, such that the terminal unit 37 (38) is exposed through an upper opening of the cylindrical body 393.

As shown in FIG. 12A, the terminal unit 37 (38) is in its natural state when the terminal unit 37 (38) is out of contact with the terminal unit 57. In this state, the terminal unit 37 (38) is at the reference position on the upper side of the flat portion 571 of the terminal unit 57, owing to the elastic restoring force of the compressed coil spring 392.

The terminal unit 57 (flat portion 571) is brought into contact with the terminal unit 37 (38) as shown in FIG. 12B, when the moving member 5A (5B) enters the range of the predetermined length corresponding to the length L1 of the flat portion 571 in the direction N, while moving along the stroke passage GL. Such a configuration allows the terminal unit 57 and the terminal unit 37 (38) to make contact with each other, thereby enabling the workpiece W on the hand 53a (53b) to be detected despite the delivery position and the initial position where the moving member 5A (5B) is supposed to be located being slightly shifted. In addition, the terminal unit 37 (38) of the guide body 3 is in the contact position displaced downward from the reference position and thus urged by the compressed coil spring 392 in the direction intersecting the direction N (upward in FIG. 12B), when the terminal unit 37 (38) is in contact with the terminal unit 57 of the moving member 5A (5B). Such a configuration assures that the terminal units 37 (38) and 57 are brought into contact with each other, thereby allowing the workpiece W on the hand 53a (53b) to be properly detected.

In the examples shown in FIGS. 13A to 14B, the terminal unit 37 (38) of the guide body 3, the terminal unit 57 of the moving member 5A (5B), and the support structure therefor are different from those shown in FIGS. 8A to 12B.

Figure 13A:
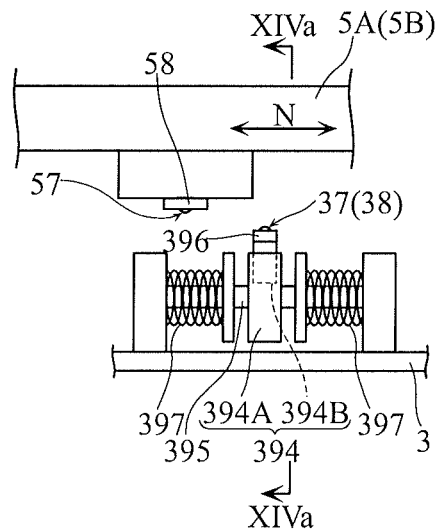
FIGS. 13A to 13C are schematic cross-sectional views showing still another example of the base unit-side terminal unit, the moving unit-side terminal unit, and the support structure therefor.
Figure 14A:
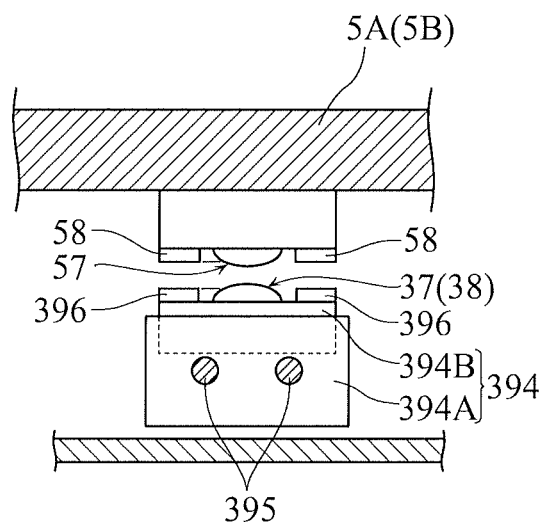
FIG. 14A is a cross-sectional view taken along a line XIVA-XIVA in FIG. 13A.

As shown in FIG. 13A, the terminal unit 37 (38) is mounted on the guide body 3 via a slider 394 in this variation. The slider 394 includes a horizontal slider 394A supported by a shaft 395 so as to horizontally slide, and a vertical slider 394B configured so as to vertically slide with respect to the horizontal slider 394A. The shaft 395 is oriented in the direction parallel to the stroke passage GL. As shown in FIG. 14A, the terminal unit 37 (38) is formed of a metal block and located at the upper end portion of the vertical slider 394B. In addition, a pair of magnets 396 is provided on the upper end portion of the vertical slider 394B, and on the respective sides of the terminal unit 37 (38). The terminal unit 37 (38) protrudes upward from the vertical slider 394B by an amount slightly larger than an amount by which the magnets 396 protrude upward from the upper end portion of the vertical slider 394B.

As shown in FIG. 14A, the terminal unit 57 of the moving member 5A (5B) is formed of a metal block, and located so as to oppose the terminal unit 37 (38) in the vertical direction when viewed in the direction parallel to the stroke passage GL. A pair of magnets 58 is provided on the moving member 5A (5B) and on the respective sides of the terminal unit 57, and the magnets 58 are respectively located so as to oppose the magnets 396 in the vertical direction when viewed in the direction parallel to the stroke passage GL. The magnetic pole of the lower face of the magnet 58 and the magnetic pole of the upper face of the magnet 396 have opposite polarities. The terminal unit 57 protrudes downward from the moving member 5A (5B) by an amount slightly larger than an amount by which the magnets 58 protrude downward from the moving member 5A (5B).

As shown in FIG. 13A, a pair of compressed coil springs 397 is provided on the respective sides of the horizontal slider 394A in the sliding direction thereof. In this variation, as shown in FIGS. 13A and 14A, the terminal unit 37 (38) is in its natural state when the terminal unit 37 (38) is out of contact with the terminal unit 57, and located at the reference position.

Figure 13B:
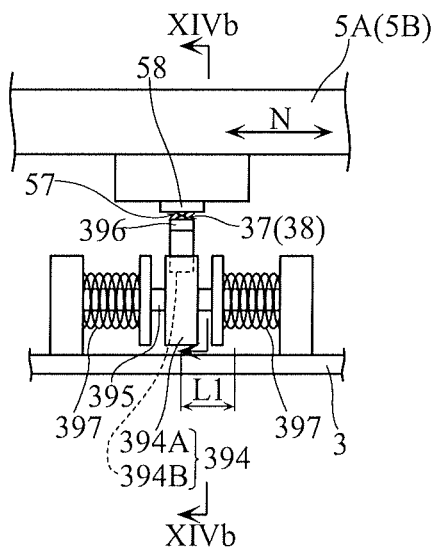
Figure 13C:
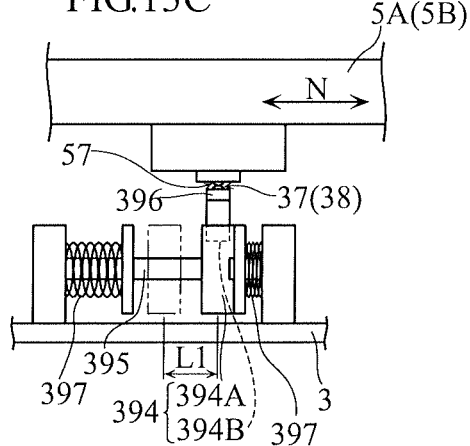
Figure 14B:
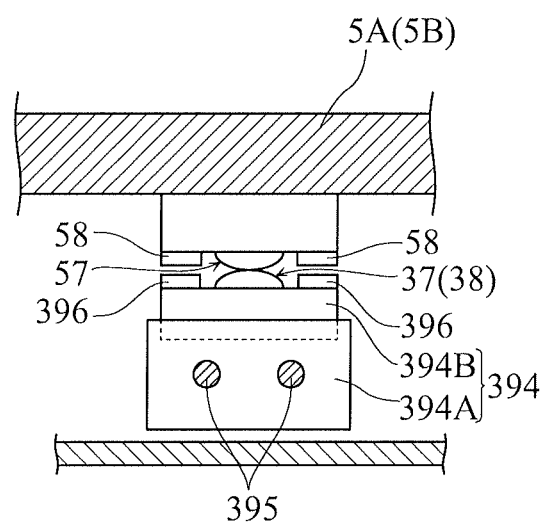
FIG. 14B is a cross-sectional view taken along a line XIVB-XIVB in FIG. 13B.

When the terminal unit 57 reaches the position to oppose the terminal unit 37 (38) in the vertical direction owing to the movement of the moving member 5A (5B) in the direction N parallel to the stroke passage GL, as shown in FIGS. 13B and 14B, the vertical slider 394B is elevated by the attractive force between the magnets 396, 58, so that the terminal unit 57 and the terminal unit 37 (38) are brought into contact with each other. At this point, the terminal unit 37 (38) is located at the contact position displaced upward from the reference position. As shown in FIGS. 13B and 13C, the terminal units 37 (38) and 57 remain in contact with each other while the moving member 5A (5B) is in the range of the predetermined length L1 in the direction N (range between the position shown in FIG. 13B and the position shown in FIG. 13), owing to the attractive force between the magnets 396, 58. When the vertical slider 394B is at the position shown in FIG. 13C, the compressed coil spring 397 shrinks to the minimal length. When the moving member 5A (5B) moves further to the right in FIG. 13C, the magnets 396 and 58 are separated from each other, so that the vertical slider 394B descends and the terminal unit 37 (38) returns to the reference position owing to the elastic restoring force of the compressed coil spring 397.

Such a configuration allows the terminal unit 57 and the terminal unit 37 (38) to make contact with each other, thereby enabling the workpiece W on the hand 53a (53b) to be detected despite the delivery position and the initial position where the moving member 5A (5B) is supposed to be located being slightly shifted. In addition, as is apparent from the aforementioned configuration, the terminal unit 37 (38) of the guide body 3 barely slides with respect to the terminal unit 57 while the terminal unit 37 (38) is in contact with the terminal unit 57 of the moving member 5A (5B). Therefore, generation of particles can be effectively suppressed.

Figure 15A:
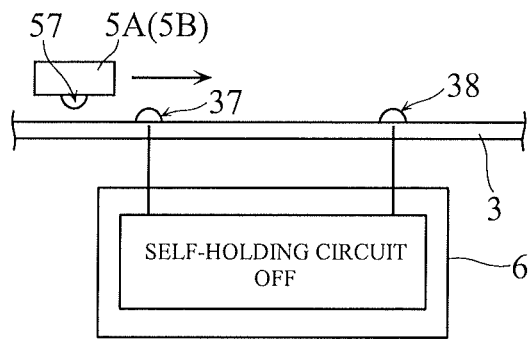
FIGS. 15A to 15D are schematic drawings showing locations of the base unit-side terminal unit and the moving unit-side terminal unit for detecting a workpiece by using a relay circuit.
Figure 15B:
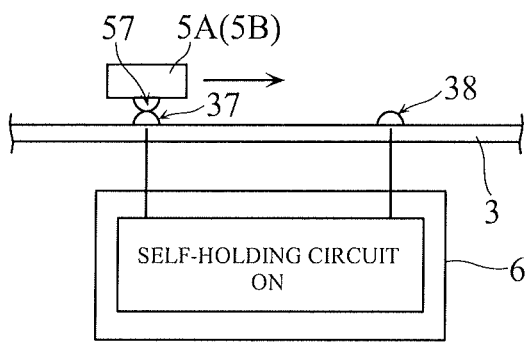
Figure 15C:
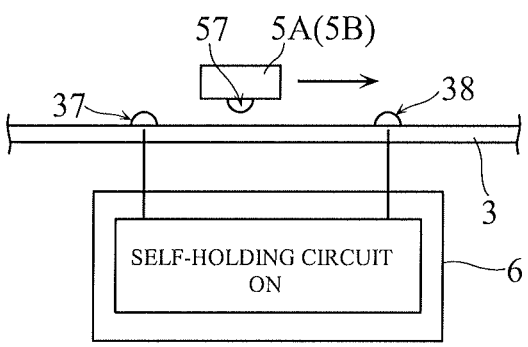
Figure 15D:
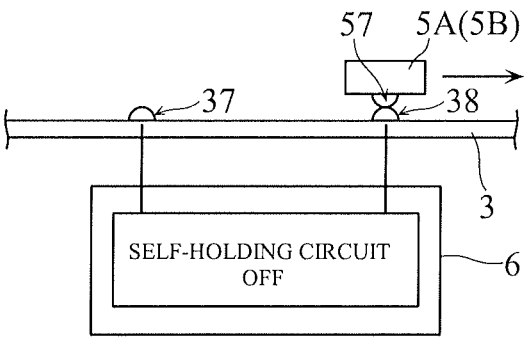

FIGS. 15A to 15D are schematic drawings showing locations of the terminal units 37, 38, and 57 for detecting the workpiece W by using a relay circuit. The control unit 6 includes a self-holding circuit including relay switches. As shown in FIG. 15B, when the terminal unit 57 of the moving member 5A (5B) makes contact with the terminal unit 37, the relay switch is turned ON, and remains in the ON state despite the terminal unit 57 being disengaged from the terminal unit 37 thereafter as shown in FIG. 15C. When the terminal unit 57 makes contact with the terminal unit 38 as shown in FIG. 15D, the relay switch is turned OFF.

The foregoing configuration allows the signal of the sensor 54 to be detected while the terminal unit 57 is in contact with the terminal unit 37 (38). Therefore, the workpiece W on the hand 53a (53b) can be detected despite the delivery position and the initial position where the moving member 5A (5B) is supposed to be located being slightly shifted, when the terminal unit 57 and the terminal unit 37 (38) are in contact with each other while the moving member 5A (5B) moves from the position shown in FIG. 15A to the position shown in FIG. 15D. In addition, as is apparent from FIGS. 15A to 15D, the contact between the terminal units 37 (38) and 57 is only momentary, and therefore generation of particles can be suppressed.

Figure 16:
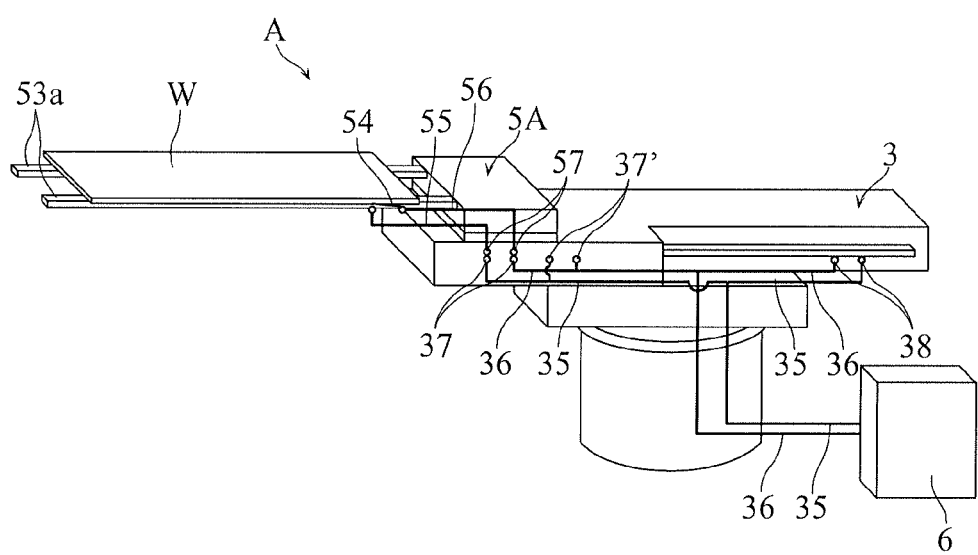
FIG. 16 is a schematic perspective view showing still another example of the wiring route in the detection unit.

In the case where the workpiece conveying robot A configured as above is installed in a transport chamber including a plurality of processing chambers located around the workpiece conveying robot A, the delivery position of the workpiece W taken when the hand 53a (53b) sticks out may be different depending on the processing chamber. Although FIGS. 6 and 7 represents the case where the hand 53a (53b)

assumes a single delivery position, the hand 53a (53b) can be made to assume two or more delivery positions by providing the terminal units corresponding to the respective delivery positions in the guide body 3. FIG. 16 illustrates a wiring arranged between the sensor 54 and the control unit 6 in the case where two delivery positions are to be taken.

The workpiece conveying robot A shown in FIG. 16 additionally includes a pair of terminal units 37' in the guide body 3, unlike in FIGS. 6 and 7. The wiring 35 has an end connected to the control unit 6, and the other end branched to be connected to the one of the terminal units 37, one of the terminal units 37', and one of the terminal units 38. The wiring 36 has an end connected to the control unit 6, and the other end branched to be connected to the other of the terminal units 37, the other of the terminal units 37', and the other of the terminal units 38.

With the foregoing configuration, the sensor 54 is brought into operation when the pair of terminal units 57 and the pair of terminal units 37 are in contact with each other, or when the pair of terminal units 57 and the pair of terminal units 37' are in contact with each other, or when the pair of terminal units 57 and the pair of terminal units 38 are in contact with each other. Thus, the workpiece W on the hand 53a (53b) can be detected by the sensor 54 when the moving member 5A (5B) is located at three different positions. The terminal units 37' additionally provided in FIG. 16 and the support structure therefor may be configured similarly to the terminal unit 37 (38) and the support structure therefor shown in FIGS. 8A to 14B.

Although the embodiment of the present invention has been described as above, it is to be understood that the present invention is in no way limited to the foregoing embodiment. Specific configuration of the components of the workpiece conveying robot according to the present invention may be modified in various manners within the scope and spirit of the present invention.

For example, although the terminal units 37, 38 of the guide body 3 are displaced between the reference position and the contact position in the foregoing embodiment, the terminal units 57 of the moving member 5A (5B) may be configured so as to be displaced between a reference position and a contact position. More specifically, the terminal units 57 may be displaced between the reference position and the contact position, in other words the positional relationship between the terminal units 57 and the moving member may be shifted, by providing any of the shifting units shown in FIGS. 8 to 13 in the moving member 5A (5B).

In the foregoing embodiment, the sensor 54 serves to detect the presence of the workpiece W. However, the sensor may be configured to detect various types of additional information about the workpiece. Examples the additional information of the workpiece include positional shift or distortion, temperature, vibration, and lot management information. To detect the positional shift of the workpiece, a load sensor such as a load cell may be employed. To detect the temperature or vibration, a temperature sensor or a vibration sensor may be employed, respectively. For the lot management, an IC tag or the like may be attached to the workpiece.

The present invention is not only applicable to a robot having a pair of hands, but also to a one-hand robot having just a single hand.

The invention claimed is:

1. A workpiece conveying robot comprising:
a base unit;
a moving unit configured to move with respect to the base unit and including a hand on which a workpiece is to be placed;
a driving mechanism that drives the moving unit; and
a detection unit that detects information about the workpiece;
the detection unit including:
a sensor provided at the hand;
a base unit-side terminal provided at the base unit; and
a moving unit-side terminal provided at the moving unit and electrically connected to the sensor;
wherein the base unit-side terminal and the moving unit-side terminal are brought into contact with each other when the moving unit is at a predetermined position.

2. The workpiece conveying robot according to claim 1, wherein the moving unit is movable along a horizontal linear stroke passage, and
the moving unit-side terminal is brought into contact with the base unit-side terminal unit when the moving unit is at any one of a first position and a second position spaced from each other along the stroke passage.

3. The workpiece conveying robot according to claim 2, wherein the base unit-side terminal includes a first terminal unit and a second terminal unit spaced from each other along the stroke passage and respectively corresponding to the first position and the second position.

4. The workpiece conveying robot according to claim 1, wherein the moving unit is movable along the horizontal linear stroke passage, and
the moving unit-side terminal is brought into contact with the base unit-side terminal unit when the moving unit is in a range of a predetermined length along the stroke passage.

5. The workpiece conveying robot according to claim 4, further comprising a shifting unit that displaces the base unit-side terminal between a reference position and a contact position, wherein the base unit-side terminal is out of contact with the moving unit-side terminal when the base unit-side terminal is at the reference position, and the base unit-side terminal is in contact with the moving unit-side terminal when the base unit-side terminal is at the contact position.

6. The workpiece conveying robot according to claim 5, wherein the shifting unit includes an elastic member that urges the base unit-side terminal in a direction intersecting the stroke passage when the base unit-side terminal is at the contact position.

7. The workpiece conveying robot according to claim 4, further comprising a shifting unit that displaces the moving unit-side terminal between a reference position and a contact position, wherein the moving unit-side terminal is out of contact with the base unit-side terminal when the moving unit-side terminal is at the reference position, and the moving unit-side terminal is in contact with the base unit-side terminal when the moving unit-side terminal is at the contact position.

8. The workpiece conveying robot according to claim 7, wherein the shifting unit includes an elastic member that urges the moving unit-side terminal in a direction intersecting the stroke passage when the moving unit-side terminal is at the contact position.

9. The workpiece conveying robot according to claim 2, wherein the driving mechanism includes a driving pulley, and an output belt engaged with the driving pulley so as to reciprocate in a predetermined range along the stroke passage, and
the moving unit is connected to the output belt via a joint member.

10. The workpiece conveying robot according to claim 1, wherein the sensor includes a plurality of sensing units.

* * * * *